United States Patent
Kobayashi

(10) Patent No.: US 8,469,703 B2
(45) Date of Patent: Jun. 25, 2013

(54) VERTICAL BOAT FOR HEAT TREATMENT AND HEAT TREATMENT METHOD OF SEMICONDUCTOR WAFER USING THEREOF

(75) Inventor: Takeshi Kobayashi, Nishishirakawa (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 1086 days.

(21) Appl. No.: 12/312,304

(22) PCT Filed: Oct. 25, 2007

(86) PCT No.: PCT/JP2007/001168
§ 371 (c)(1),
(2), (4) Date: May 5, 2009

(87) PCT Pub. No.: WO2008/062550
PCT Pub. Date: May 29, 2008

(65) Prior Publication Data
US 2010/0048034 A1 Feb. 25, 2010

(30) Foreign Application Priority Data
Nov. 21, 2006 (JP) .................. 2006-314578

(51) Int. Cl.
*F27D 5/00* (2006.01)
(52) U.S. Cl.
USPC ........... 432/253; 432/249; 432/258; 432/261; 432/241; 118/728; 118/725; 118/715; 118/500
(58) Field of Classification Search
USPC .......... 432/253, 258, 261, 241, 254; 118/728, 118/725, 715, 500, 724; 438/795
See application file for complete search history.

(56) References Cited

U.S. PATENT DOCUMENTS

| | | | |
|---|---|---|---|
| 3,753,299 A * | 8/1973 | Schreiner .................. | 34/237 |
| 4,981,222 A * | 1/1991 | Lee .......................... | 211/41.18 |
| 5,310,339 A * | 5/1994 | Ushikawa .................. | 432/253 |
| 5,679,168 A * | 10/1997 | Porter et al. ............... | 118/725 |
| 6,062,853 A | 5/2000 | Shimazu et al. | |
| 6,395,363 B1 * | 5/2002 | Ballance et al. ........... | 428/64.1 |
| 2006/0027171 A1 * | 2/2006 | Hsu et al. .................. | 118/728 |

FOREIGN PATENT DOCUMENTS

| | | |
|---|---|---|
| EP | 0 962 556 A1 | 12/1999 |
| JP | A-10-092757 | 4/1998 |
| JP | A-2000-053497 | 2/2000 |
| JP | A-2004-241545 | 8/2004 |
| JP | A-2005-159028 | 6/2005 |

* cited by examiner

*Primary Examiner* — Avinash Savani
(74) *Attorney, Agent, or Firm* — Oliff & Berridge, PLC

(57) ABSTRACT

A vertical boat for heat treatment includes a plurality of supporting columns, a pair of plate members coupled to both ends of each supporting column. In each of the supporting columns a plurality of supporting parts for horizontally supporting substrates to be treated are formed and an auxiliary supporting member to place each of the substrates to be treated is removably attached to each of the plurality of supporting parts. The auxiliary supporting member is adjusted for each supporting part with respect to the inclination of a surface for placing the substrates to be treated depending on the shape of each supporting part by processing a surface for attaching to the supporting part, or by interposing a spacer between the supporting part and the auxiliary supporting member is provided.

20 Claims, 12 Drawing Sheets

FIG. 2
(A)
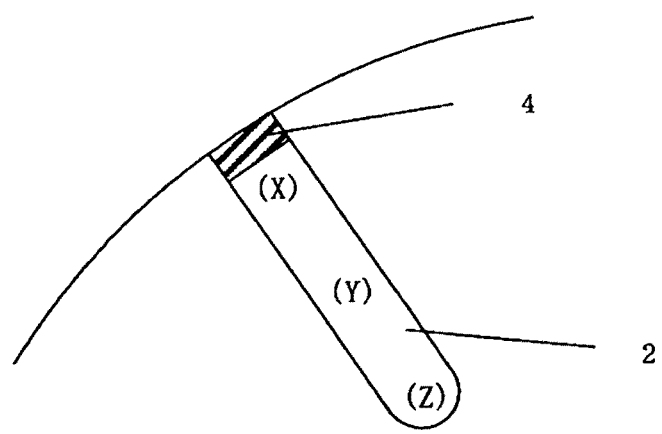
(B)
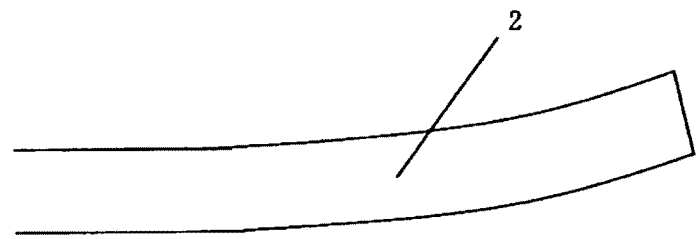
(C)
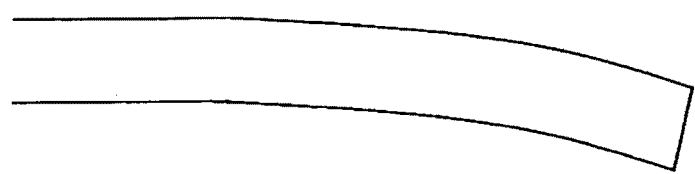
(D)

FIG. 3
(A)
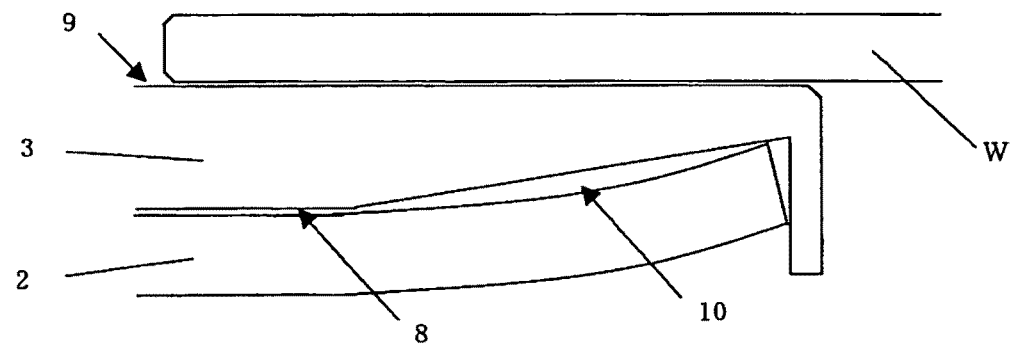
(B)
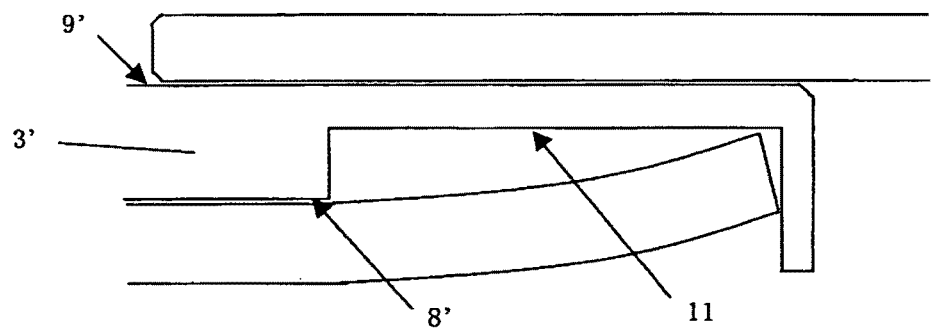
(C)
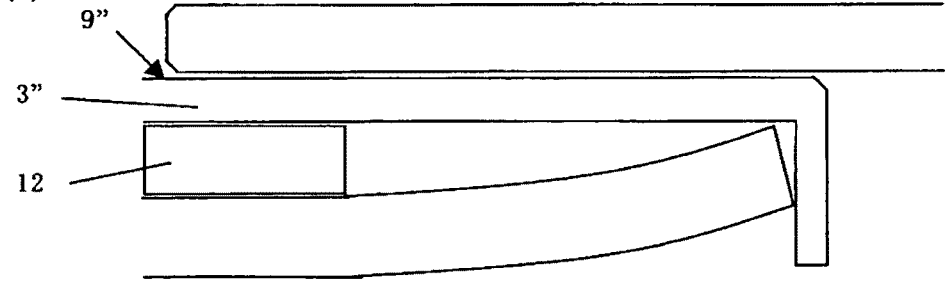
(D)
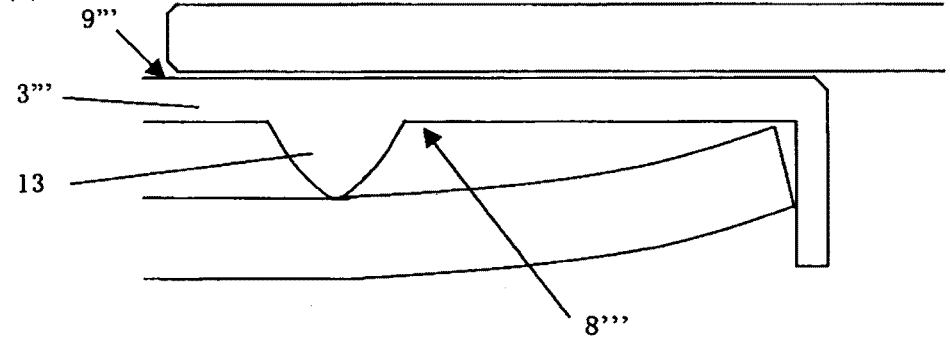

103

FIG. 5
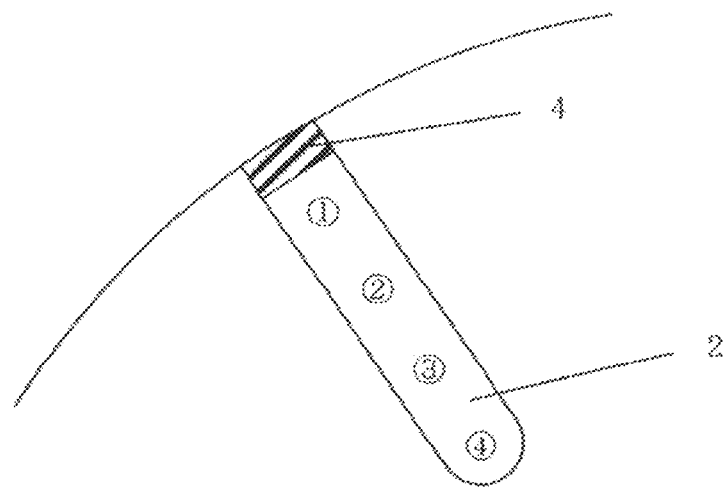
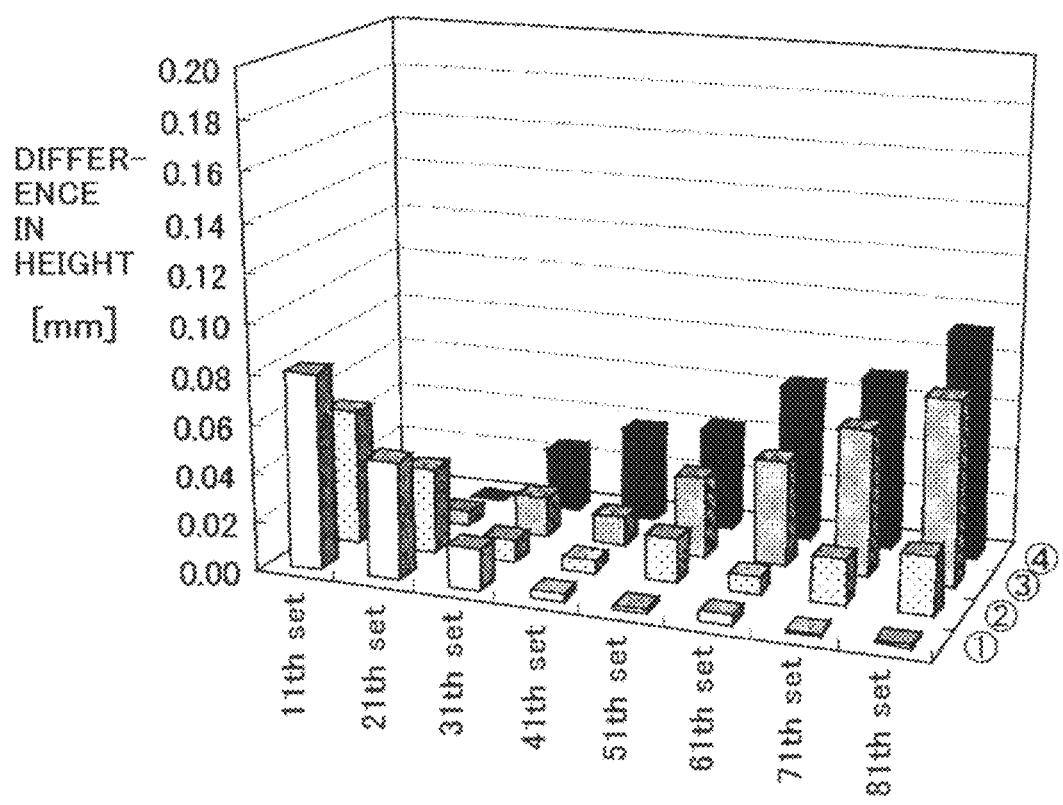

FIG. 6
(A) EXAMPLE 1
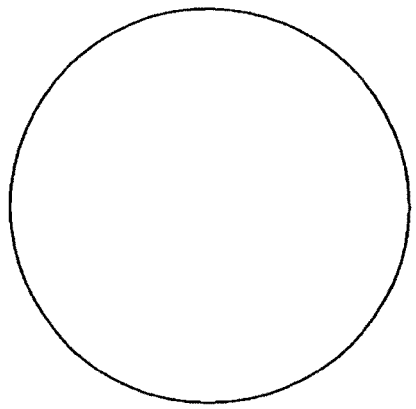
(B) EXAMPLE 2
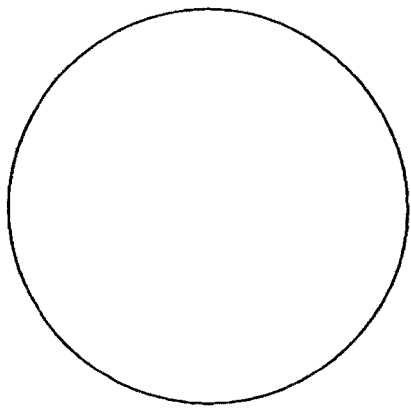
(C) EXAMPLE 3
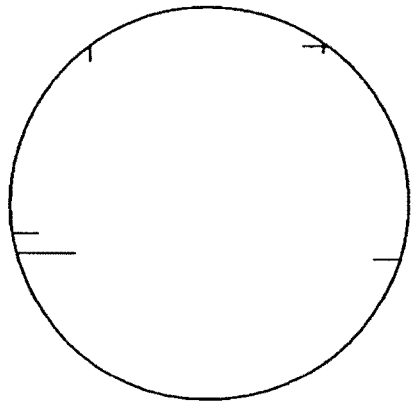
(D) EXAMPLE 4
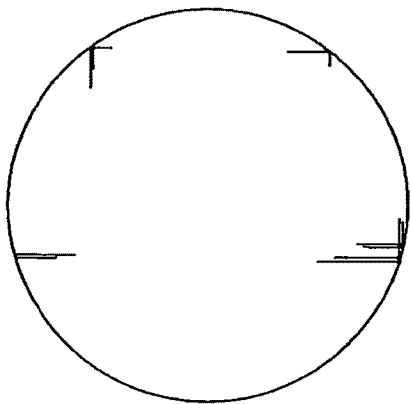
(E) COMPARATIVE EXAMPLE 1
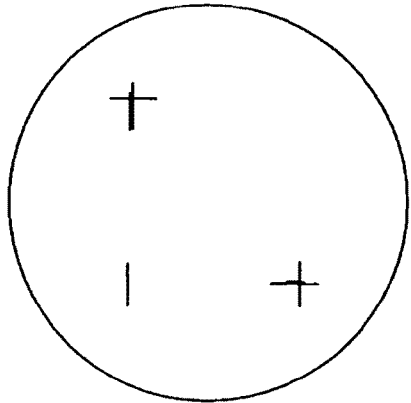

FIG. 7
(A) EXAMPLE 5
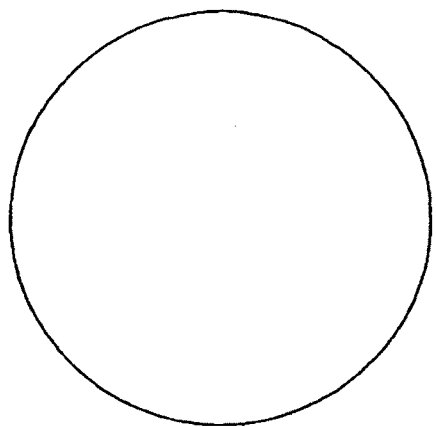
(B) EXAMPLE 6
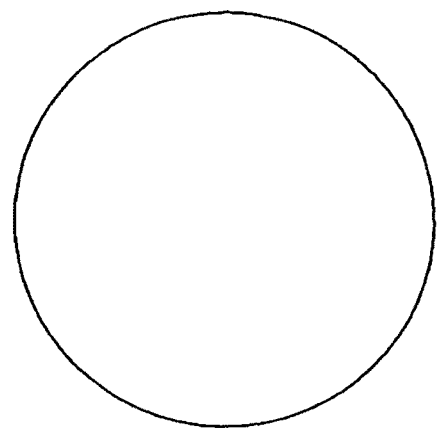
(C) EXAMPLE 7
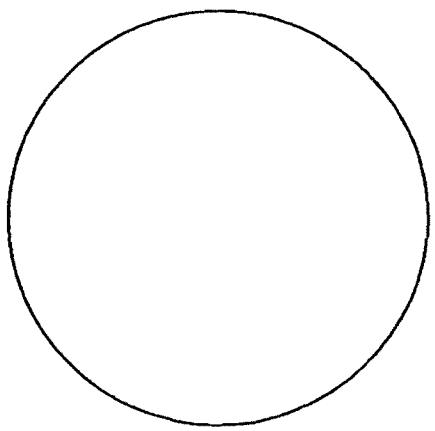
(D) COMPARATIVE EXAMPLE 2
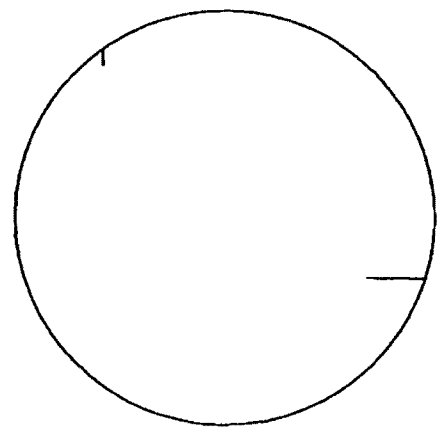

VERTICAL BOAT FOR HEAT TREATMENT AND HEAT TREATMENT METHOD OF SEMICONDUCTOR WAFER USING THEREOF

TECHNICAL FIELD

The present invention relates to a vertical boat for heat treatment mainly used for performing a heat treatment on a semiconductor wafer and the like, and to a heat treatment method of a semiconductor wafer using it.

BACKGROUND ART

In a case that devices are produced by using a semiconductor single crystal wafer such as a silicon wafer, there are many steps from processing of the wafer to formation of a device. There is a step of heat treatment as one of these steps. The heat treatment step is an important process that is performed for the purpose of formation of a defect-free layer in a surface layer of the wafer, gettering, crystallization, formation of oxide film, impurity diffusion, and the like.

As a diffusion furnace used in such heat treatment step such as oxidization or impurity diffusion (an apparatus for oxidization and diffusion), along with a diameter of a wafer being larger, there has been mainly used a vertical furnace for heat treatment in which the heat treatment is performed with many wafers being horizontally supported at a predetermined interval. When a wafer is subjected to heat treatment by using such a vertical furnace for heat treatment, there is used a vertical boat for heat treatment (hereinafter, occasionally referred to as "a boat for heat treatment" or simply "a boat") for setting many wafers.

FIG. 8 schematically shows a conventional general vertical boat for heat treatment 210. A pair of plate members (coupling members, also referred to as a top plate and a bottom plate) 216 are coupled to both ends of four supporting columns (rods) 214. Many slits 211 are formed in each of the supporting columns 214 and a convex part between the slits 211 acts as a supporting part 212 for the wafer. When wafers are subjected to heat treatment, the peripheral part of a wafer W is placed on the supporting parts 212 formed at the same height in each of the supporting columns 214, as shown in a plane view in FIG. 9(A) and a front view in FIG. 9(B), and thereby the wafer W is horizontally supported.

FIG. 10 is a schematic view for showing an example of a vertical furnace for heat treatment. In a boat for heat treatment 210 carried into an interior of a reaction chamber 222 of the vertical furnace for heat treatment 220, many wafers W are supported horizontally. At heat treatment, the wafers W are heated with a heater 224 provided around the reaction chamber 222. During heat treatment, gas is introduced into the reaction chamber 222 through a gas-introducing duct 226, flows from the upper side to the lower side, and is discharged outside from a gas-discharging duct 228. The gas to be used is different according to a purpose of heat treatment. However there are mainly used $H_2$, $N_2$, $O_2$, Ar, and the like. In the case of impurity diffusion, these gasses are also used as a carrier gas for an impurity compound gas.

Various shapes are employed for a wafer supporting part 212 in a vertical boat for heat treatment 210, some examples of which are shown in FIGS. 11(A) and (B). In (A), semicircular supporting parts 212 are formed by providing concave slits (grooves) 211 in a cylindrical supporting column 214. In (B), on the other hand, rectangular supporting parts 213 are formed by providing concave slits 211 in a wide prismatic supporting column 215 so as to support wafers W at a position closer to the center than in the example shown in (A). There are other supporting parts having slits with other shapes such as arc shape or hook shape.

There are also proposed a relatively large plate-shaped supporting part (supporting plate) provided in a supporting column so as to support a wafer in a stable manner (see Japanese Unexamined Patent Publication (Kokai) No. 2000-53497), a supporting part having steps on its upper surface so as to support wafers having a different diameter (see Japanese Unexamined Patent Publication (Kokai) No. 2005-159028), and the like.

As for a material of a boat used for silicon wafers, for example, materials such as quartz ($SiO_2$), silicon carbide (SiC), silicon (Si), and the like are usually used in order to prevent wafers from being contaminated. During heat treatment at a high temperature more than 1000° C., for example, a boat made from SiC or Si, which has higher heat resistance than a boat made from quartz ($SiO_2$), is preferably used. Especially, a boat made from SiC is frequently used because it can be processed more easily, and it can more greatly reduce metallic contamination generated during heat treatment by providing CVD-SIC coating, compared to a boat made from Si.

When a heat treatment is performed at a high temperature especially for the purpose of oxidation or diffusion of impurities using a vertical boat for heat treatment, internal stress is caused due to a wafer's own weight, or thermal stress is caused due to non-uniform temperature distribution in the wafer. If such a stress exceeds a critical value, a slip dislocation, which is a crystal defect, is generated in the wafer. Since this critical value for the generation of this dislocation becomes rapidly small at a higher temperature, it is known that the slip dislocation is easily generated with a higher temperature. If a device is formed at a location where a slip dislocation has been generated, junction leakage and the like are caused, so that device production yield was sometimes remarkably reduced.

When a conventional boat with supporting parts 212 or 213 being formed is used as shown in FIG. 11(A) or (B), for example, slip dislocation is easily generated at a location of a wafer which comes in contact with each of the tips of the supporting parts 212 or 213. This is because point contact is sometimes caused at such a tip.

Especially in a case of a boat for heat treatment coated with CVD-SiC, its surface is very rough, i.e., has Ra (center line average roughness) of about 1 µm. When a wafer is placed on such a supporting part, the wafer is considered to be supported at a very small elevated portion (local projection) as the point contact. Thus the internal stress due to the wafer's own weight is considered to be increased locally, so that slip dislocation is easily generated.

In order to prevent generation of such slip dislocation, measures are taken such that the tip of the supporting part is chamfered or that the elevated portion of the wafer supporting part is removed by polishing its surface.

But a supporting part of a boat for heat treatment has a problem of being broken easily by a chamfering or polishing processing by means of a machine or the like because it is thin and fragile. If a single supporting part is broken, a whole boat becomes a failure product. Therefore, it becomes necessary to polish manually surfaces of the supporting parts in order to completely mirror-polish the surfaces. In that case, roughness in each surface of the supporting parts tends to vary. In addition, since mirror-polishing of all supporting part surfaces requires a lot of labor, so that the resulting boat becomes very expensive.

Besides, in order to establish the optimal shape of the supporting part with respect to surface roughness, a chamfer of the tip, and the like, various boats for heat treatment having various surface roughness and various chamfered shapes need to be made, and a lot of experiments need to be conducted in advance. As boats for heat treatment are expensive, preparing various boats for heat treatment used for the experiments is very expensive.

In order to solve these problems, Japanese Unexamined Patent Publication (Kokai) No. 2004-241545 discloses a boat having wafer supporting parts to which auxiliary supporting members are removably attached. According to the disclosure, in the case of such a boat, since the auxiliary supporting member can be removably attached, it can be subject to chamfering or polishing processing inexpensively and easily as desired on its surface for placing a wafer, and furthermore, when the polished or otherwise processed auxiliary supporting member is attached to the supporting part and then a wafer is placed on it to be subjected to heat treatment, generation of slip dislocation can be suppressed effectively.

DISCLOSURE OF INVENTION

A boat such as the one disclosed in the above-described Japanese Unexamined Patent Publication (Kokai) No. 2004-241545 can be regarded to be effective for preventing generation of slip dislocation due to the elevated portions on the supporting part surface. But the conventional boat of this type cannot prevent generation of slip dislocation due to inclination of the supporting part. Especially since the inclination of the supporting part varies for each supporting part, it was found that a conventional auxiliary supporting member with the identical shape cannot handle this problem.

In view of such problems as described above, an object of the present invention is to provide a vertical boat for heat treatment, in particularly, which can effectively prevent the generation of the slip dislocation due to an inclination of each supporting part supporting a substrate to be treated such as a semiconductor wafer during a heat treatment of the substrate in a vertical furnace for heat treatment, and which is inexpensive and can be easily improved, and to provide a heat treatment method of a semiconductor wafer.

In order to accomplish the above object, there is provided according to the present invention, a vertical boat for heat treatment having at least a plurality of supporting columns, a pair of plate members, each coupled to each of the both ends of each supporting column, in which in each of the supporting columns a plurality of supporting parts for horizontally supporting substrates to be treated are formed and an auxiliary supporting member to place each of the substrates to be treated is removably attached to each of the plurality of supporting parts, the vertical boat for heat treatment wherein the auxiliary supporting member is adjusted for each supporting part with respect to the inclination of a surface for placing the substrates to be treated depending on the shape of each supporting part, by processing a surface for attaching to the supporting part, or by interposing a spacer between the supporting part and the auxiliary supporting member.

With such a vertical boat for heat treatment, since the auxiliary supporting member can be adjusted with respect to the inclination of a surface for placing depending on the shape of each supporting part, by processing a surface for attaching of the auxiliary supporting member (not of the supporting part), or by using a spacer, it is not necessary to process the supporting part sophisticatedly, painfully or time-consumingly in order to adjust the inclination of the supporting part. Therefore, the boat can be produced inexpensively and easily.

In addition, since the inclination of the surface for placing of the auxiliary supporting member can be adjusted with high precision for each supporting part, especially generation of the slip dislocation due to the inclination of each supporting part can be effectively suppressed, when a substrate to be treated such as a semiconductor wafer is placed on the auxiliary supporting member for heat treatment.

As the capability of suppressing the generation of slip dislocation can be thus increased, the annealing time period can be shortened and the slit pitch of the boat can be reduced, so that annealed wafers can be produced efficiently and improvement on production cost can be realized.

It is possible that the auxiliary supporting member is processed on the surface for attaching so as to have a recess, to have a tapering shape, or alternatively to have a projection shape.

Since the auxiliary supporting member may thus be processed on its surface for attaching depending on the shape of each supporting part so as to have a recess, a tapering shape, or a projection shape, and since this recess, tapering shape, or projection shape can handle the shape of each supporting part, the inclination of the surface for placing can be adjusted. As a result, generation of the slip dislocation due to an inclination of the supporting part or the like can be effectively prevented.

The present invention is also provided with a heat treatment method of a semiconductor wafer using the above-described vertical boat for heat treatment comprising the steps of: measuring a shape of each supporting part of each supporting column; processing each of the auxiliary supporting members on the surface for attaching, selecting one of the auxiliary supporting members processed on the surface for attaching depending on the measured shape of each supporting part, and attaching the selected auxiliary supporting member onto the supporting part, or selecting a selected spacer depending on the measured shape of each supporting part, and attaching the auxiliary supporting member onto the supporting part with interposing the selected spacer; thereby adjusting the inclination of the surface for placing of the auxiliary supporting member, depending on each supporting part; then placing the semiconductor wafer onto the surface for placing; and performing a heat treatment.

With such a heat treatment method of a semiconductor wafer, since the semiconductor wafer can be placed onto the surface for placing and be heated, after selecting one of the auxiliary supporting member processed on the surface for attaching depending on the measured shape of each supporting part, and attaching the selected auxiliary supporting member onto the supporting part, or selecting a spacer depending on the measured shape of each supporting part, and attaching the auxiliary supporting member onto the supporting part with interposing the spacer, thereby adjusting the inclination of the surface for placing of the auxiliary supporting member, depending on each supporting part, especially generation of the slip dislocation due to an inclination of the supporting part can be effectively suppressed.

As the capability of suppressing the generation of slip dislocation can be increased, the annealing time period can be shortened and the slit pitch of the boat can be reduced, so that annealed wafers can be produced efficiently and improvement on production cost can be realized.

It is preferable that the inclination of the surface for placing of the auxiliary supporting member is adjusted so as that the angle formed between the surface for placing and the semiconductor wafer placed on the surface for placing is within ±0.2°.

By thus adjusting the inclination of the surface for placing of the auxiliary supporting member so as that the angle formed between the surface for placing and the semiconductor wafer placed on the surface for placing is within ±0.2°, the inclination of the surface for placing can be made sufficiently small against the semiconductor wafer supported horizontally. Thus the area that the wafer contacts with the surface for placing can be made not too small and loading can be distributed, so that generation of the slip dislocation could be effectively prevented.

As described above, the vertical boat for heat treatment and the heat treatment method of a semiconductor wafer using it according to the present invention enables the inclination of the surface for placing to be adjusted by processing the surface for attaching of the auxiliary supporting member or by way of a spacer. Therefore, it is not necessary that the supporting part is processed sophisticatedly, painfully or time-consumingly, so that the boat can be produced inexpensively and easily, and at the same time the inclination of the surface for placing can be adjusted with high precision. As a result, high-quality substrates such as semiconductor wafers can be obtained, where generation of the slip dislocation due to an inclination of the supporting part is effectively suppressed.

As the capability of suppressing the generation of slip dislocation can be increased, the annealing time period can be shortened and the slit pitch of the boat can be reduced, so that annealed wafers can be produced with efficient heat treatment and the production cost can be reduced.

BRIEF DESCRIPTION OF DRAWINGS

FIG. 2 is a schematic view for showing exemplary shapes of supporting parts;

FIG. 3 is an explanatory view for illustrating exemplary relationships between an auxiliary supporting member and a supporting part;

FIG. 5 is a graph for showing measured results of shapes of supporting parts by a 3D measuring instrument;

FIG. 6 is an observation view for showing measured results of slip dislocation in Examples 1 through 4 and Comparative Example 1;

FIG. 7 is an observation view for showing measured results of slip dislocation in Examples 5, 6 and 7, and Comparative Example 2;

BEST MODE FOR CARRYING OUT THE INVENTION

Hereinafter, embodiments of the present invention are described, though the present invention is not limited to them.

When a substrate to be treated such as a semiconductor wafer is subject to heat treatment, there is mainly used a vertical furnace for heat treatment in which the heat treatment is performed with many wafers being horizontally supported at a predetermined interval. For this heat treatment, there is used a vertical boat for heat treatment for setting many wafers. With a conventional boat, slip dislocation is sometimes generated on a wafer after the heat treatment.

The slip dislocation is generated because the conventional boat for heat treatment has a very rough surface which is coated with CVD-SiC, for example, so that a wafer, when placed on it, is sometimes supported by the surface as a point-contact.

For the problem of the slip dislocation generation due to a local projection, Japanese Unexamined Patent Publication (Kokai) No. 2004-241545 discloses a boat having wafer supporting parts to which auxiliary supporting members with a mirror-polished or otherwise processed planer surface are removably attached. Though the boat is effective to some extent, slip dislocation was still generated on the wafer after the heat treatment.

The inventors of the present invention have diligently examined on the above-described generation of the slip dislocation, and found with respect to a boat disclosed in Japanese Unexamined Patent Publication (Kokai) No. 2004-241545 that the conventional problem of the slip dislocation generation due to local projections on the supporting part surface was improved, but that the generation of slip dislocation due to inclination of the supporting part could not be prevented.

However, it is extremely difficult from the aspect of processing accuracy in the production of a vertical boat for heat treatment to control the inclination of the groove by machining it on the order of several tens of μm and by fine-adjusting the inclination of the supporting part to obtain a desired shape of the supporting part. Manual processing, on the other hand, requires labor and time, and tends to cause variable results.

The inventors of the present invention have found that an inclination of a surface on which a wafer is placed can be adjusted easily with high precision for each supporting part by attaching an removal auxiliary supporting member to the supporting part, and by processing the auxiliary supporting member on its surface for attaching or by interposing a spacer between the supporting part and the auxiliary supporting member, depending on a shape of each supporting part, and have completed the present invention.

Hereinafter, though a vertical boat for heat treatment according to the present invention and a heat treatment method of a semiconductor wafer using it will be specifically described in reference to the drawings, the present invention is not limited to them.

Figure 1:
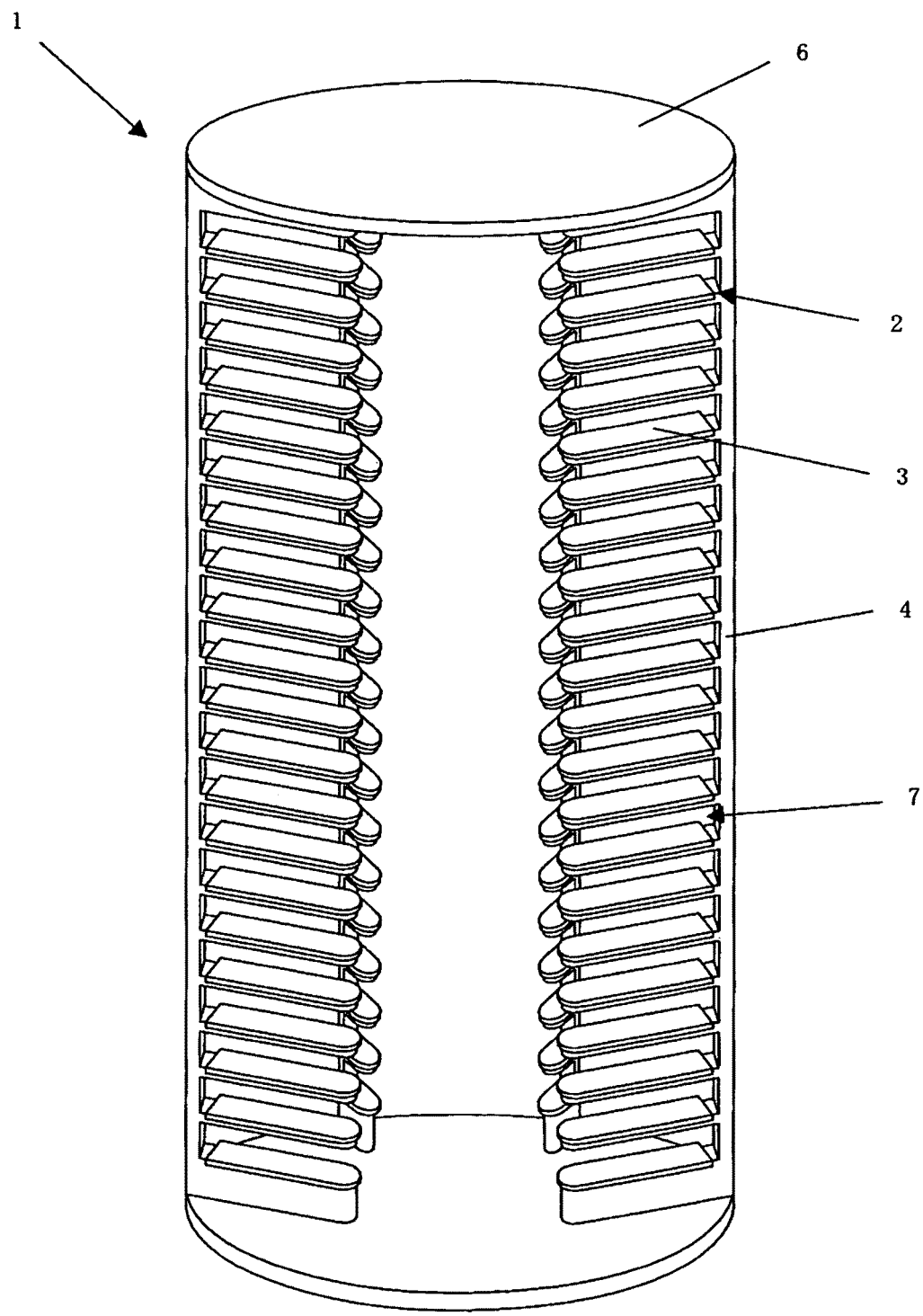
FIG. 1 is a schematic view for showing an example of a vertical boat for heat treatment according to the present invention.

FIG. 1 shows an example of a vertical boat for heat treatment which is equipped with supporting parts of the supporting columns and auxiliary supporting members according to the present invention. This boat for heat treatment 1 includes four supporting column 4 and a pair of plate members 6 coupled to both ends of each supporting column 4. A plurality of slits (grooves) 7 are formed being equally spaced each other at the identical height in each of the supporting columns 4, and convex parts between the slits 7 act as supporting parts 2 for semiconductor wafers. In the case of the boat for heat treatment 1 according to the present invention, an auxiliary supporting members 3 are removably attached on the supporting parts 2 of each supporting column 4. When wafers are subjected to heat treatment, each one of the wafers is placed on the auxiliary supporting members 3 attached to the supporting parts 2, each located at the same height of each supporting columns 4.

Now, the relationships between the supporting part 2 and the auxiliary supporting member 3 will be described.

As described above, it is difficult from the limitation in processing accuracy to control the shape such as inclination of the supporting parts 2 by processing them on the order of several tens of µm, so that each of the supporting parts 2 varies in shape in micro scales. Such supporting parts with different shapes are shown in FIG. 2.

FIG. 2(A) is a plan view of a supporting part 2, and FIGS. 2(B) through 2(D) are cross-sectional views of different supporting parts 2.

As shown in FIG. 2(A), a region of the supporting part 2 in the vicinity of the supporting column is defined as region X, a region around the tip of the supporting part is defined as region Z, and a region in the middle of them is defined as region Y. As shown in FIG. 2(B), first, for example, a supporting part 2 which has a shape inclined in the upward direction from region X toward region Z. On the contrary, a supporting part which has a shape inclined in the downward direction from region X toward region Z, as shown in FIG. 2(C) is also given. There is also a supporting part, as shown in FIG. 2(D), where region Y is elevated in the upward direction and inclination is caused from region X to region Y, and also from region Y to region Z.

Naturally, a supporting part 2 may also have inclinations in various three dimensional directions in the micro scales on the order of several tens of µm, not being limited to the shapes shown in FIGS. 2(B) through 2(D).

Figure 4:
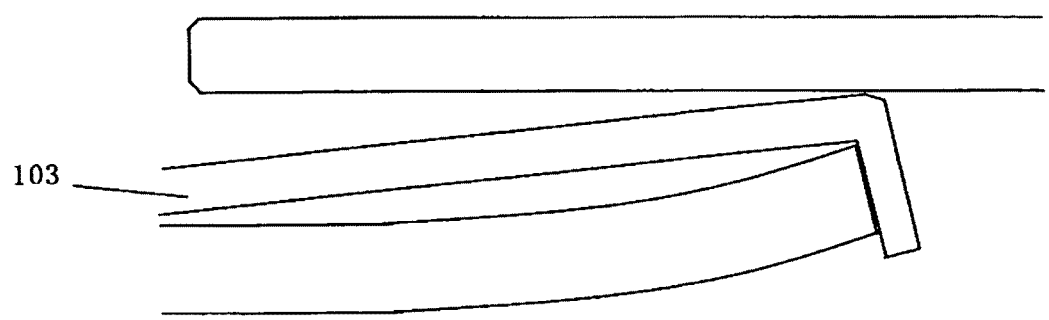
FIG. 4 is an explanatory view for illustrating example of an auxiliary supporting member being in point-contact with a wafer.
Figure 8:
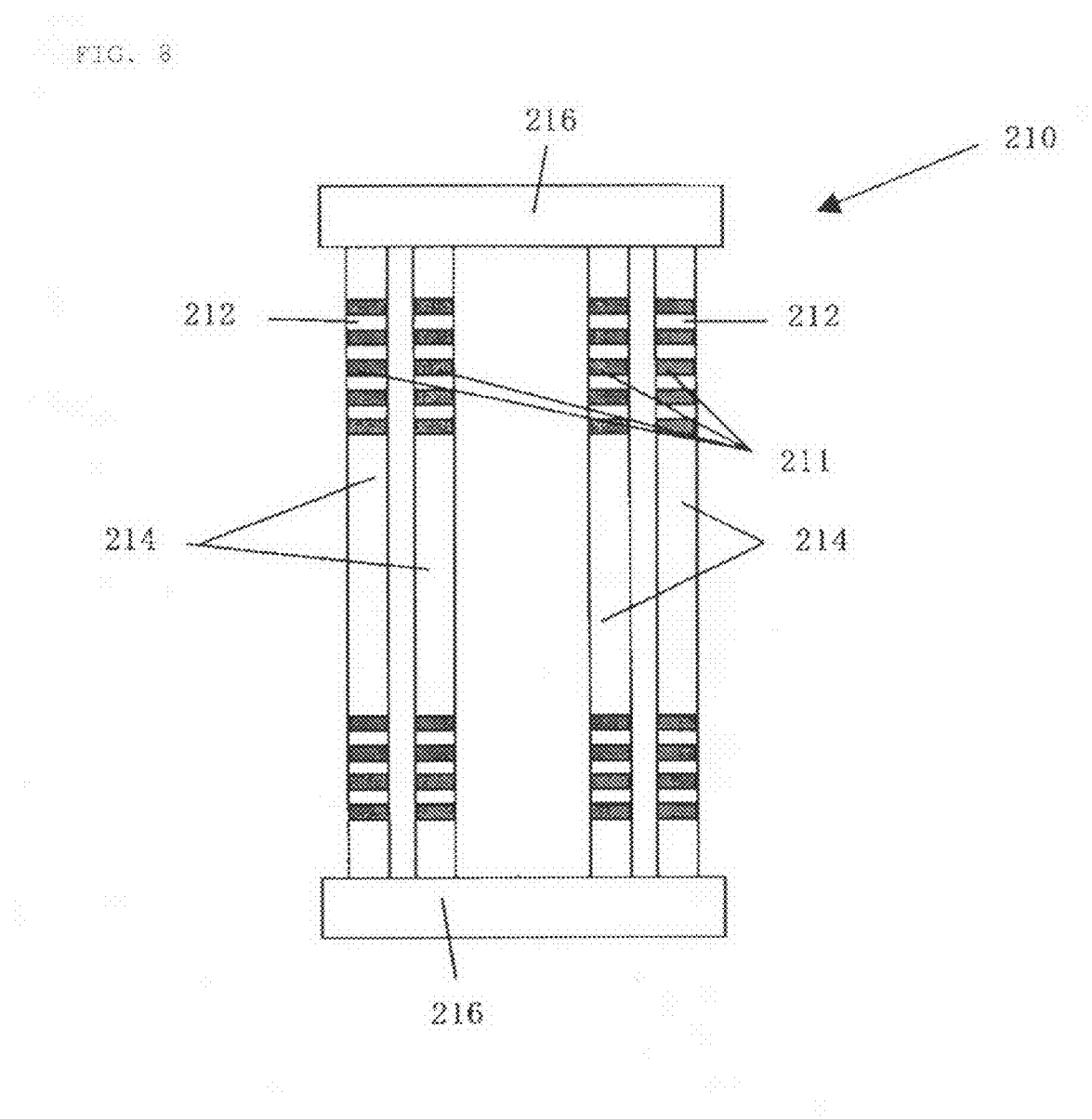
FIG. 8 is a schematic view for showing an example of a conventional vertical boat for heat treatment.
Figure 9:
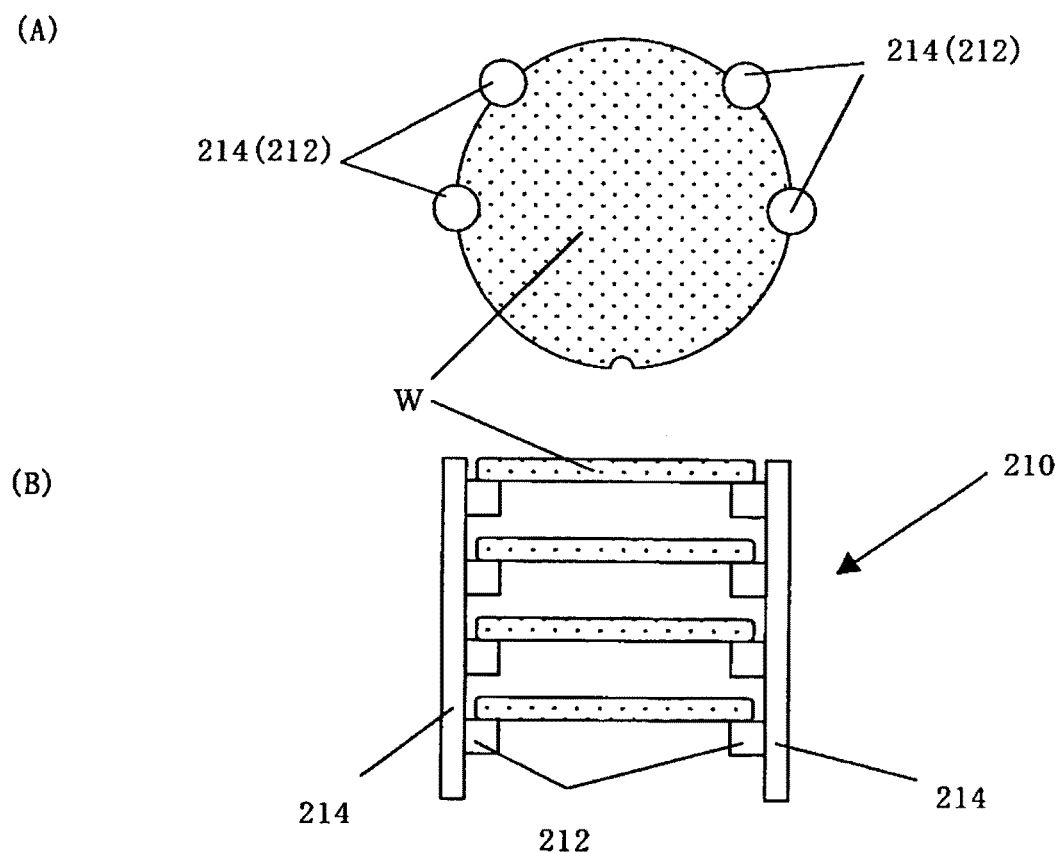
FIG. 9 is an explanatory view for illustrating a conventional vertical boat for heat treatment with wafers set in it.

When a supporting part 2 has such inclined shape, if this supporting part 2 is simply used, or if a conventional planar auxiliary supporting member 103 with the identical shape used only for the purpose of suppressing local projections on the supporting part surface is attached to such a supporting part 2, without considering the inclination, an area contacting with the wafer and supporting the wafer is limited to a very narrow area as shown in FIG. 4, so that load is concentrated. When a wafer is subjected to a heat treatment in such a supported status, a slip dislocation is generated at the wafer.

In the boat of the present invention, on the other hand, the auxiliary supporting member 3 is processed on a surface for attaching to the supporting part 2, or a spacer is interposed between the supporting part 2 and the auxiliary supporting member 3, depending on the shape of each supporting part 2 in order to prevent generation of slip dislocation due to such inclination of the supporting part 2.

Hereinafter, the case in which a supporting part 2 is inclined to the upward direction toward tip region Z as shown in FIG. 2(B) is described as an example. The present invention, however, is not limited to this shape, and can be similarly adapted to shapes of the supporting part 2 with other shapes shown in FIG. 2 as well as shapes not shown in FIG. 2. In addition, in this example, the inclination of the surface for placing a wafer of auxiliary supporting member is exemplary adjusted to be horizontal so as not to make a contact region with the horizontally supported wafer too narrow, but it is not limited to be horizontal but the inclination can be adjusted to any desired one.

First, an example in which an auxiliary supporting member is processed on the surface for attaching is described.

In an example shown in FIG. 3(A), an auxiliary supporting member 3 is processed on the surface for attaching 8 so as to have a tapering shape 10 toward its tip region, depending on the shape of the supporting part 2 and is attached to the supporting part 2. Thereby a surface 9 for placing a wafer of the auxiliary supporting member 3 can be adjusted with respect to its inclination, i.e., can be horizontal as desired. Therefore, this supporting part 2 can support the wafer, which is supported horizontally, without point-contact with it.

In an example shown in FIG. 3(B), an auxiliary supporting member 3' is processed on the surface for attaching 8' so as to have a recess 11, depending on a shape of the supporting part 2 and is attached to the supporting part 2. Thereby a surface 9' for placing a wafer of the auxiliary supporting member 3' which is again adjusted with respect to its inclination, i.e., is horizontal as desired.

Furthermore, as in an example shown in FIG. 3(D), an auxiliary supporting member 3''', is processed to have a projection 13 on the surface for attaching 8''' may be attached, so that the inclination of a surface 9''', for placing a wafer can be adjusted.

Any auxiliary supporting members 3, 3' and 3''' are sufficient as far as they have a suitably processed shape for each case on the surfaces for attaching 8, 8' and 8''', such as a tapering shape 10, recess 11 or projection 13 depending on a shape of the supporting part 2, and thus their surfaces 9, 9' and 9''' for placing a wafer are adjusted to a desirable inclination (in the examples shown above, horizontally) when the auxiliary supporting members 3, 3' and 3''' are attached to the supporting part 2.

In other words, a shape formed on the surface for attaching by processing such as the tapering shape, recess or projection is not specifically limited, and can also be appropriately adjusted with respect to its location, depth and so on. Also, the shape can be formed considering the thickness of the auxiliary supporting member or the like. Furthermore, the shape is not limited to a tapering shape, recess or projection. The shape may just follow the measured shape of the supporting part.

The inclination of the surface for placing may also be adjusted by interposing a spacer between the supporting part and the auxiliary supporting member.

In FIG. 3(C), the auxiliary supporting member 3" is attached to the supporting part 2 by interposing a spacer 12 therebetween depending on a shape of the supporting part 2. Thus the surface 9" for placing a wafer of the auxiliary supporting member 3" is again adjusted with respect to the inclination, i.e., is horizontal as described.

As for this auxiliary supporting member 3", a similar auxiliary supporting member as a conventional one may be used. The surface for placing 9" of the auxiliary supporting member 3" may be adjusted at a desirable inclination (in the example above, horizontal) by the spacer 12. The material, thickness or the number of the spacers 12 are not specifically limited. They can be appropriately determined depending on the substrates to be treated or the shape of the supporting part.

The auxiliary supporting member 3 of the boat 1 according to the present invention can be made, for example, to have a planar surface (a surface 9 for placing a wafer and the like) by means of a mirror-polishing processing or to have a chamfered edge portion. It is naturally possible to perform similar processing as in the case of the auxiliary supporting members of a conventional boat. By performing such processing, slip dislocation can be prevented more effectively from generating when the wafer is supported is subjected to heat treatment.

As for the parts other than the above-described auxiliary supporting member 3, for example, supporting part 2, supporting column 4, plate member 6 and the like are not limited with respect to their materials or numbers. They may be similar ones as the conventional parts, for example.

As described above, with a vertical boat for heat treatment 1 according to the present invention, since an auxiliary supporting member 3 processed on its surface for attaching 8 is attached, or it is attached by interposing a spacer 12 between the supporting part 2 and the auxiliary supporting member 3, even in a supporting part 2 with any shape, depending on the shape, the inclination of the surface for placing 9 could be fine adjusted for each of the supporting parts, so that the inclination can be set easily at a desirable one.

Therefore, to begin with, it is not necessary to process the supporting part 2 sophisticatedly or painfully for adjusting the inclination of the supporting part 2 itself, the boat can be produced inexpensively and easily.

In addition, that the inclination of surface for placing 9 can be adjusted by processing the surface for attaching 8 of the removable auxiliary supporting member 3 or by using a spacer 12, the inclination of the surface for placing 9 can be adjusted at extremely high precision. Therefore, the boat 1 has the surfaces for placing 9 which were fine adjusted to appropriate inclinations, and thus the generation of slip dislocation can be remarkably suppressed, when the wafers are placed in the boat 1 and subjected to heat treatment. Especially it is highly capable of suppressing the generation of slip dislocation due to the inclination of the supporting part 2, which could not be prevented conventionally.

As this capability of suppressing the generation of slip dislocation is thus improved, a wafer can be supported and heat-treated without slip dislocation being generated, for example at a high temperature at which slip dislocation tends to be produced more frequently, so that the annealing time period can be shortened by the high-temperature treatment.

Furthermore, even with a shape of boat having narrow slit pitches such that a generation ratio of slip dislocation was high by using a conventional boat, generation of slip dislocation can be prevented effectively, so that high-quality annealed wafers can be obtained. In other words, reducing the slit pitch can be achieved.

Thus, annealed wafer with higher quality can be obtained more efficiently than a conventional boat, so that improvement on production cost and production yield can be realized.

By the way, for preventing generation of slip dislocation due to local projection of supporting part surface of the conventional boat, BMD was also utilized in the wafer to be treated. This measure, however, was inefficient in production, i.e., time and labor are consumed more than enough, since BMD had to be grown more in number or size than necessary during wafer production (crystal growth) in order to prevent generation of the slip dislocation. But with a boat 1 according to the present invention, even if the BMD in the wafer to be treated is not intentionally grown to such density or size needed conventionally, the inclination of the surface for placing 9 is sufficiently adjusted, and the point-contact with the wafer does not occur. As a result, annealed wafers with a high quality can be obtained by sufficiently suppressing the generation of the slip dislocation, and thus productivity can be improved. With thus small BMD density or the like, pattern displacement can be considered to be prevented effectively at the pattern formation during the device processes.

Hereinafter, a heat treatment method of a semiconductor wafer using vertical boat for heat treatment according to the present invention will be described. Note that the inclination of the surface for placing a wafer of the auxiliary supporting member is adjusted to be horizontal in this example so as not to make a contact region with the horizontally supported wafer too narrow, but it is naturally not limited to be horizontal.

First, the shape of each supporting part 2 formed in each supporting column 4 is measured by a 3D measuring instrument. As 3D measuring instrument, Crysta-Apex C manufactured by Mitutoyo is given, for example, though it is not limited to this instrument and any instrument can be used as far as the shape of the supporting part 2 can be appropriately measured.

Then, a surface for attaching 8 of a separately prepared auxiliary supporting member 3 is processed so as to have a recess 11, tapering shape 10 or a projection 13, for example. Depending on the measured shape of each supporting part 2, an auxiliary supporting member 3 appropriately processed on its surface for attaching 8 is selected respectively so as to be attached to the supporting part 2.

Alternatively, by selecting an appropriate spacer 12 depending on the measured shape of each supporting part 2, an auxiliary supporting member 3 is attached to the supporting part 2 with interposing the spacer 12.

Thus by processing appropriately a surface for attaching 8 of the auxiliary supporting member 3 or by interposing appropriately a spacer 12 between the supporting part 2 and the auxiliary supporting member 3, the inclination of the surface for placing 9 of the auxiliary supporting member 3 is fine adjusted to a desired value (here horizontally) for each supporting part 2 by adapting to the shape of each supporting part 2.

After the fine adjustment for each supporting part 2, a semiconductor wafer is placed on the surface for placing 9.

Figure 10:
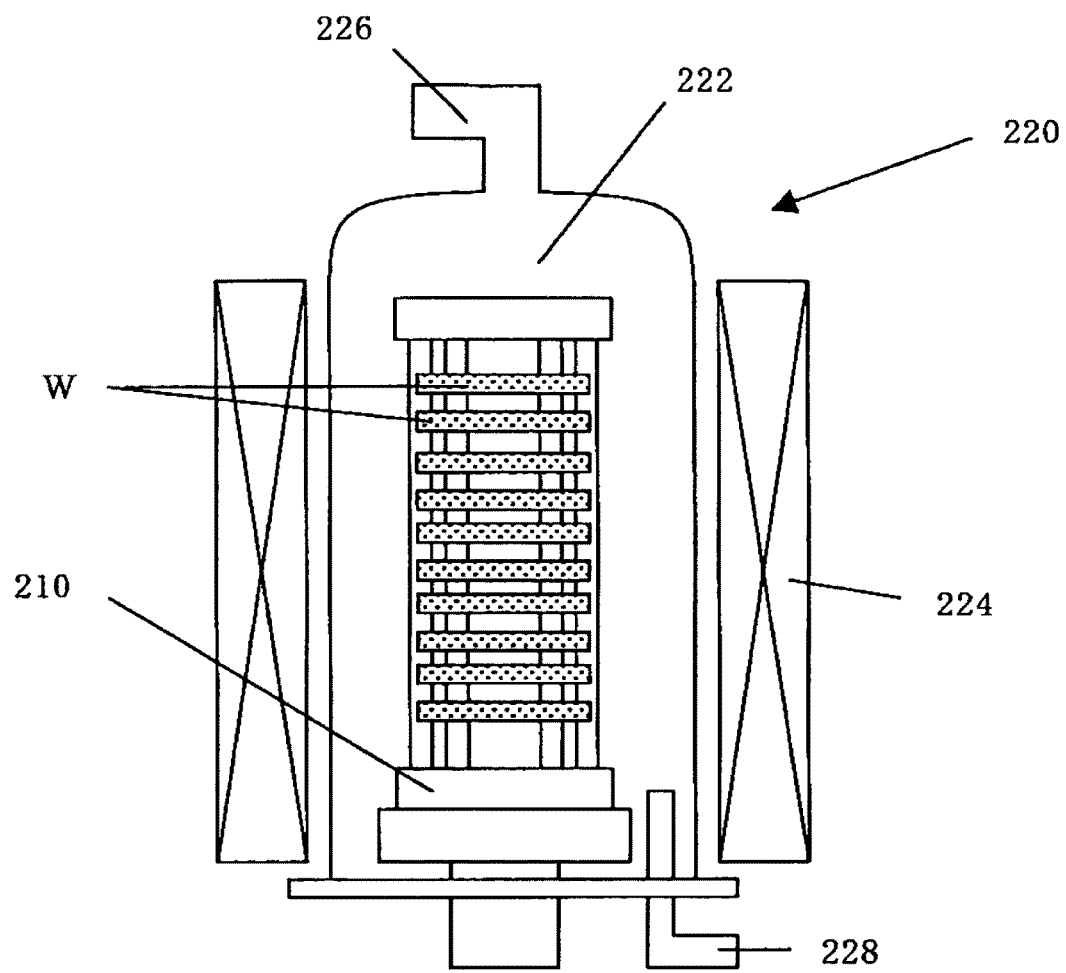
FIG. 10 is a schematic view for showing an example of vertical furnace for heat treatment.
Figure 11:
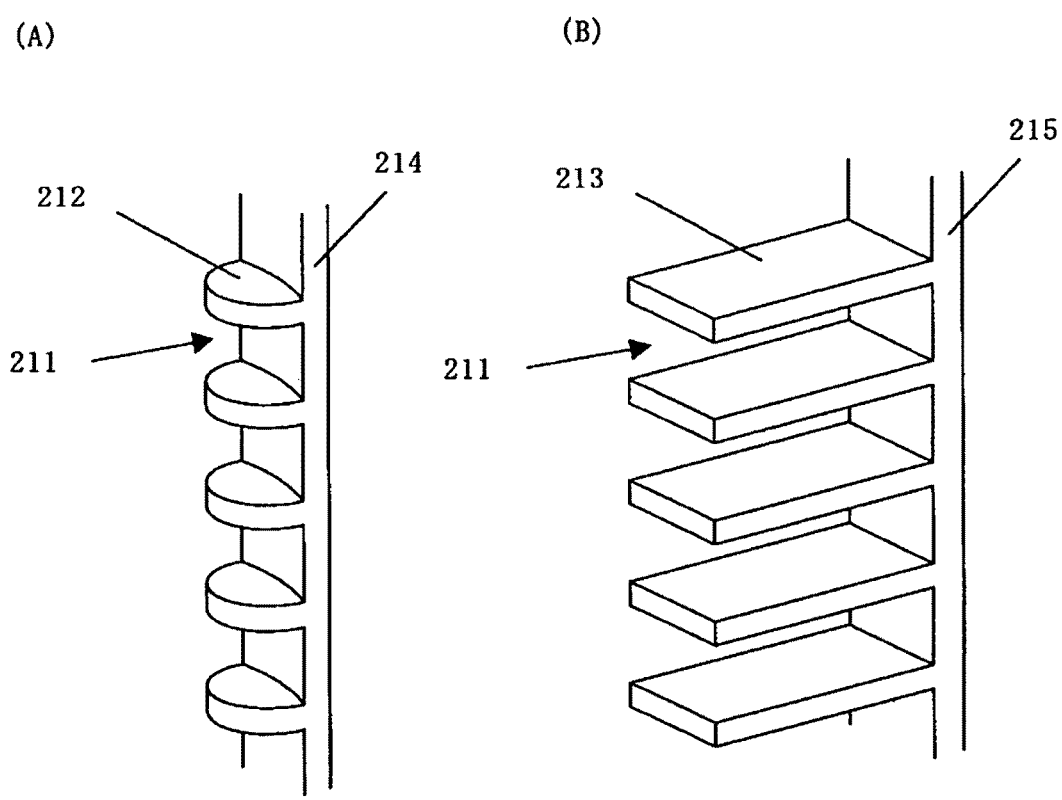
FIG. 11 is a schematic view for showing examples of wafer supporting parts for a conventional vertical boat for heat treatment.

After each of a plurality of semiconductor wafers is supported horizontally by each supporting part by way of each auxiliary supporting member 3, the boat 1 according to the present invention is introduced into a vertical furnace for heat treatment as shown in FIG. 10 so that the wafers are subject to the heat treatment with a gas supplied into the furnace.

For adjusting the inclination of the surface for placing 9, it is preferable that the angle formed between the surface for placing 9 and the semiconductor wafer placed on the surface for placing 9 is within ±0.2°. By making the angle formed between the surface for placing 9 and the semiconductor wafer horizontally supported, i.e. the horizontal plane within ±0.2°, the surface for placing 9 is not contacted locally with the horizontally supported wafer restrictedly at a local area, so that loading can be sufficiently distributed and that the point contact with the wafer can be prevented more effectively. As a result the generation of slip dislocation can be suppressed.

With such a heat treatment method of a semiconductor wafer according to the present invention, it is especially possible to sufficiently prevent generation of slip dislocation due to inclination of the supporting part, and thus to raise the annealing temperature, to shorten the annealing time period, and to reduce the slit pitch of the boat, so that improvement on production cost and the like can be realized.

EXAMPLES

Example 1

First, similarly in a conventional one, a body of a vertical boat for heat treatment having four prismatic supporting columns, a pair of plate members coupled to both ends of four supporting columns and 100 supporting parts provided at each supporting column was produced by machining process. The body of the boat for heat treatment was made from SiC, on which surface CVD-SiC was coated so that surface roughness was made to be Ra of about 1 μm.

The shape of supporting part of the body of the boat for heat treatment was measured by a 3D measuring instrument (Crysta-Apex C manufactured by Mitsutoyo). The result is shown in FIG. 5.

Figure 12:
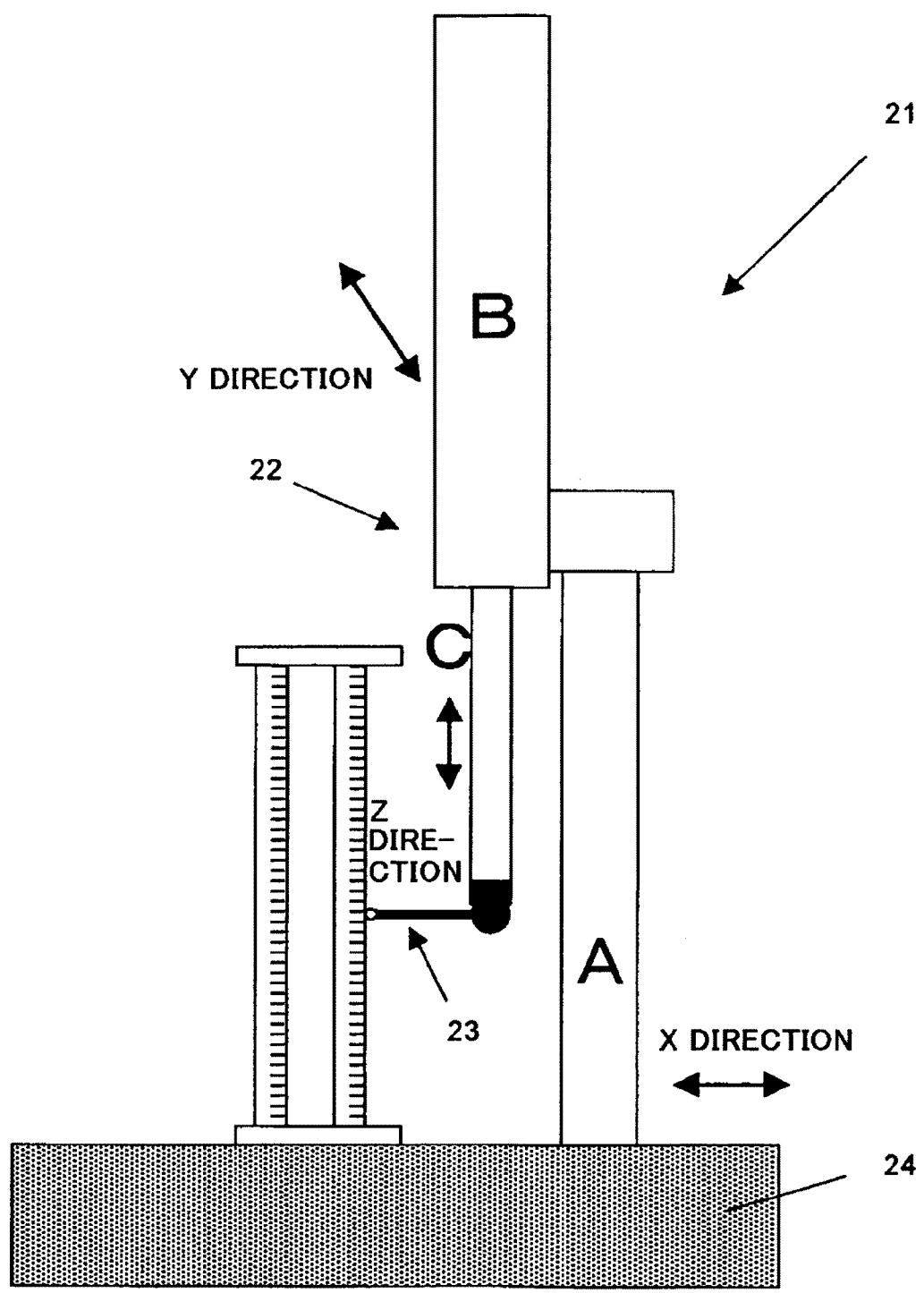
FIG. 12 is an explanatory view for illustrating an example of a measurement method of a shape of a supporting part using a 3D measuring instrument.

First, a measurement method using the 3D measuring instrument is schematically illustrated in FIG. 12. This 3D measuring instrument 21 is provided with an arm 22 having parts A, B and C, each being movable in X, Y or Z direction, respectively, a probe 23 provided at the tip of the arm 22, a stone plate 24 on which an object to be measured (vertical boat for heat treatment) is placed. The above described probe 23 can be rotated, and on the tip of the probe 23 a ruby ball is attached. For measurement, by adjusting a position by means of the arm 22 and the probe 23, a ruby ball of the probe 23 is pressed on four portions (See FIG. 5) of each supporting part of the vertical boat for heat treatment, and thereby Z coordinate of each portion can be evaluated. The reference point of the Z coordinate is set to be the upper surface of the stone plate 24.

In FIG. 5, shapes of each one supporting part of the 11th, 21st, 31st, 41st, 51st, 61st, 71st and 81st (counted from the upper side of the body of the boat) supporting part sets are shown as representatives measured supporting parts. In other words, though all four supporting parts supporting a wafer were in fact measured, (16 portions (4×4) in total were measured for one set), and Z coordinate of the lowest portion is set to be 0, measurement data for only one supporting part among four measured supporting parts were shown as representative in FIG. 5. Therefore, the lowest bar sometimes is not 0 in the graph of FIG. 5.

As shown in FIG. 5, each supporting part has various shapes, so that it is apparent that the inclination is generated.

Depending on the shape of each supporting part, an appropriate spacer was selected among various spacers. For example, a spacer (silicon plate) having a thickness of 75 μm was selected for the supporting parts shown of the 81st set in FIG. 5.

As shown in FIG. 3(C), one piece of the above-described spacer was arranged at a lower side, i.e., at a base side of each supporting part of the 81st set, and the auxiliary supporting member was attached to the supporting part such that the spacer was interposed between the auxiliary supporting member and the supporting part, thereby adjusting the inclination of the surface for placing. As the auxiliary supporting member, one made of SiC substrate coated with SiC of which surface for placing was polished was used.

Thus attaching an auxiliary supporting member to each supporting part with an appropriate spacer interposed therebetween, a substrate to be treated (a silicon wafer grown by Czochralski method and mirror-polished with plane orientation of (100), diameter of 200 mm and thickness of 725 μm) was placed on it, and then the boat was introduced into a vertical furnace for heat treatment so that the wafer was subject to the heat treatment with a gas supplied into the furnace.

More specifically, the wafers were introduced from the lower side of the furnace for heat treatment at 700° C., the furnace was then heated to 1200° C. After the wafers were subjected to the heat treatment at 1200° C. for one hour, the furnace was cooled to 700° C., and the wafers were pulled out from the furnace.

Each of thus heat-treated annealed wafers was evaluated by means of the XRT (evaluation of slip dislocation by X-ray diffraction) on whether the slip dislocation was generated or not. As is shown in FIG. 6(A), slip dislocation was not generated and a high-quality annealed wafer could be obtained.

Examples 2 Through 4

To each supporting part of the 81st set of a similar boat as in the case of Example 1, a similar auxiliary supporting member as in Example 1 was attached with two spacers (Example 2), three spacers (Example 3) and four spacers (Example 4), being interposed therebetween, respectively, and then a similar wafer was placed so as to perform a similar heat treatment.

As a result, as shown in FIG. 6(B) for Example 2, FIG. 6(C) for Example 3, and FIG. 6(D) for Example 4, respectively, no slip dislocation was generated in Example 2, while slip dislocations were generated in the peripheral area of the wafer in Examples 3 and 4. In addition, when the number of the spacers was increased and the inclination of the surface for placing was intentionally increased, denser or stronger slip dislocations were confirmed to be generated, compared to Example 1 (which used one spacer) and Example 2 (which used two spacers), in which no slip dislocation was generated. In other words, loading was shifted to a greater extent to the base side of the supporting part, and stronger slip dislocations were confirmed in the peripheral area of the wafer in Example 4 compared to Example 3 depending on the number of the spacers.

Comparative Example 1

To each supporting part of the 81st set of a similar boat as in the case of Example 1, a similar auxiliary supporting member as in Example 1 was attached interposing no spacer, and then a similar wafer as in Example 1 was placed so as to perform a similar heat treatment.

As a result, as shown in FIG. 6(E), slip dislocations were generated in the inner side of the wafer.

It is considered that that the slip dislocations were generated since the inclination of the surface for placing was not adjusted using a spacer as in the case of Example 1, and the heat treatment was performed in a point-contact status with the placed wafer at the tips due to the inclination of the supporting parts themselves.

It is apparent that in Examples 1 and 2 the inclinations were adjusted by interposing a spacer having an appropriate thickness between the supporting parts and the auxiliary supporting members, so that the point contacts with a wafer at the tips, and consequently the generation of slip dislocations could be prevented.

As slip dislocations were generated in Examples 3 and 4, it is apparent that the inclinations of the surfaces for placing greatly influence the generation of the slip dislocations. Therefore, the spacer is to be appropriately selected, depending on the shapes (such as inclination) of the supporting parts.

In Comparative Example 1, where the supporting parts were located at a higher position at the tip side and no spacer was used, slip dislocations were generated at the tip side as shown in FIG. 6(E). In Example 1 (FIG. 6(A)) and Example 2 (FIG. 6(B)), where one or two spacers having a thickness of 75 μm for example were used, on the other hand, generation of slip dislocation could be prevented. Furthermore, when more spacers were used as in Example 3 (FIG. 6(C)), where the supporting parts were higher at the base side, slip dislocations were generated this time at the base side. Furthermore, in Example 4 (FIG. 6(D)), where much more spacers were used, much stronger slip dislocations were generated at the base side.

The angle formed between the horizontal surface and the surface for placing of the auxiliary supporting member (i.e., the angle formed between the wafer to be placed and the surface for placing of the auxiliary supporting member) was +0.04° in Example 1, −0.17° in Example 2, and −0.38° in Example 3, −0.60° in Example 4 and +0.26° in Comparative Example 1, respectively. Here, the angle is denoted with plus when the surface was higher at the tip side than at the base side, and with minus when vice versa. Thus it becomes apparent that generation of the slip dislocation can be prevented when the angle formed between the horizontal surface and the surface for placing of the auxiliary supporting member was within ±0.2°.

Please note that the supporting part had a length of 2 cm in the above described Examples 1 through 4, Comparative Example 1 and other Examples and Comparative Examples described below. The angle formed between the horizontal surface and the surface for placing of the auxiliary supporting member was calculated based on this condition.

Example 5

To each supporting part of 11th set of a similar boat as in the case of Example 1, an appropriate auxiliary supporting member having a recess (with a depth of 60 μm at the base side) was attached on the surface for attaching. The angle between the horizontal surface and the surface for placing of the auxiliary supporting member was −0.03°.

Then, a similar wafer as in Example 1 was placed thereon so as to perform similar heat treatment.

As a result, slip dislocation was not generated, and a high-quality annealed wafer could be obtained, as shown in FIG. 7(A).

Example 6

To each supporting part of 11th set of a similar boat as in the case of Example 1, an appropriate auxiliary supporting member having a tapering shape (60 μm thicker at the tip side) on the surface for attaching was attached. The angle between the horizontal surface and the surface for placing of the auxiliary supporting member was −0.04°.

Then, a similar wafer as in Example 1 was placed thereon so as to perform similar heat treatment.

As a result, slip dislocation was not generated, and a high-quality annealed wafer could be obtained, as shown in FIG. 7(B).

Example 7

To each supporting part of 11th set of a similar boat as in the case of Example 1, an appropriate auxiliary supporting member having a projection (60 μm high from the surface for attaching) on a surface for attaching was attached. The angle between the horizontal surface and the surface for placing of the auxiliary supporting member was −0.02°.

Then, a similar wafer as in Example 1 was placed thereon so as to perform similar heat treatment.

As a result, slip dislocation was not generated, and a high-quality annealed wafer could be obtained, as shown in FIG. 7(C).

Comparative Example 2

To each supporting part of 11th set of a similar boat as in the case of Example 1, an auxiliary supporting member similar as in Example 1 with a non-processed surface for attaching was attached. The angle between the horizontal surface and the surface for placing of the auxiliary supporting member was −0.23°. Then, a similar wafer was placed so as to perform similar heat treatment.

As a result, slip dislocations were generated in the peripheral area of the wafer, as shown in FIG. 7(D).

As described above, it is apparent that by selecting and attaching depending on a shape of the supporting part, an auxiliary supporting member among the members which are processed on the surface for attaching and thereby have a recess, tapering shape or a projection, the inclination of the surface for placing can be fine adjusted, as a result the generation of slip dislocation can be effectively prevented.

Though the 11th and 81st sets were used as an example in the above-described examples, other supporting parts could be similarly adjusted, according to the present invention, with respect to the inclination of the surface for placing a wafer. By thus appropriately adjusting the inclination, the generation of slip dislocation could be prevented. As for the supporting part of the 31st set, no auxiliary supporting member having a tapering shape, recess, projection, or a spacer was necessary, as the supporting part was almost horizontal.

The present invention is not limited to the embodiments described above. The above-described embodiments are merely examples, and those having the substantially same constitution as that described in the appended claims and providing the similar working effects are included in the scope of the present invention.

The invention claimed is:

1. A vertical boat for heat treatment comprising: a plurality of supporting columns, each supporting column extending vertically between an upper end and a lower end thereof, a pair of plate members, including an upper plate member coupled to the upper ends of the supporting columns and a lower plate member coupled to the lower ends of the supporting columns, the supporting columns comprising a plurality of slits spaced apart and a plurality of supporting parts interposed between the slits for horizontally supporting substrates to be treated, each supporting part being formed on the supporting column and having a curvilinear shape, and a plurality of auxiliary supporting members, each auxiliary supporting member being removably attached to one and only one corresponding supporting part, each auxiliary supporting member having a lower surface and a downward extension that contacts an upper surface of the corresponding supporting part when the auxiliary supporting member is attached to the corresponding supporting part and an upper surface for contacting one of the substrates, wherein the lower surface of a first auxiliary supporting member of the plurality of auxiliary supporting members is shaped to accommodate the shape of the corresponding supporting part such that the upper surface of the first auxiliary support member is at a predetermined inclination when the first auxiliary supporting member is attached to the corresponding supporting part of the first auxiliary supporting member.

2. The vertical boat for heat treatment according to claim 1, wherein the lower surface of the first auxiliary supporting member has a recess.

3. The vertical boat for heat treatment according to claim 1, wherein the lower surface of the first auxiliary supporting member has a tapering shape.

4. The vertical boat for heat treatment according to claim 1, wherein the lower surface of the first auxiliary supporting member has a projection shape.

5. A heat treatment method of a semiconductor wafer using the vertical boat for heat treatment according to claim 1, comprising steps of:

measuring the shape of each supporting part of each supporting column;

for a first supporting part, selecting an auxiliary supporting member from the plurality of auxiliary supporting members, the lower surface of the selected auxiliary supporting member being shaped to accommodate the measured shape of the first supporting part, and attaching the selected auxiliary supporting member onto the first supporting part; then, adjusting an inclination of the upper surface of the selected auxiliary supporting member based on the measured shape of the first supporting part; then placing the semiconductor wafer onto the upper surface of the selected auxiliary supporting member; and performing a heat treatment.

6. A heat treatment method of a semiconductor wafer using the vertical boat for heat treatment according to claim 2, comprising steps of:

measuring the shape of each supporting part of each supporting column;

for a first supporting part, selecting an auxiliary supporting member from the plurality of auxiliary supporting members, the lower surface of the selected auxiliary supporting member being shaped to accommodate the measured shape of the first supporting part, and attaching the selected auxiliary supporting member onto the first supporting part; then adjusting an inclination of the upper surface of the selected auxiliary supporting member based on the measured shape of the first supporting part; then placing the semiconductor wafer onto the upper surface of the selected auxiliary supporting member; and performing a heat treatment.

7. A heat treatment method of a semiconductor wafer using the vertical boat for heat treatment according to claim 3, comprising steps of:

measuring the shape of each supporting part of each supporting column;

for a first supporting part, selecting an auxiliary supporting member from the plurality of auxiliary supporting members, the lower surface of the selected auxiliary supporting member being shaped to accommodate the measured shape of the first supporting part, and attaching the selected auxiliary supporting member onto the first supporting part; then adjusting an inclination of the upper surface of the selected auxiliary supporting member based on the measured shape of the first supporting part; then placing the semiconductor wafer onto the upper surface of the selected auxiliary member; and performing a heat treatment.

8. A heat treatment method of a semiconductor wafer using the vertical boat for heat treatment according to claim 4, comprising steps of:

measuring the shape of each supporting part of each supporting column;

for a first supporting part, selecting an auxiliary supporting member from the plurality of auxiliary supporting members, the lower surface of the selected auxiliary supporting member being shaped to accommodate the measured shape of the first supporting part, and attaching the selected auxiliary supporting member onto the first supporting part; then adjusting an inclination of the upper surface of the selected auxiliary supporting member based on the measured shape of the first supporting part; then placing the semiconductor wafer onto the upper surface of the selected auxiliary supporting member; and performing a heat treatment.

9. The heat treatment method of a semiconductor wafer according to claim 5, wherein the inclination of the upper surface of the selected auxiliary supporting member is adjusted so that an angle between the upper surface of the selected auxiliary supporting member and the semiconductor wafer placed on the upper surface of the selected auxiliary supporting member is within ±0.2°.

10. The heat treatment method of a semiconductor wafer according to claim 6, wherein the inclination of the upper surface of the selected auxiliary supporting member is adjusted so that an angle between the upper surface of the selected auxiliary supporting member and the semiconductor wafer placed on the upper surface of the selected auxiliary supporting member is within ±0.2°.

11. The heat treatment method of a semiconductor wafer according to claim 7, wherein the inclination of the upper surface of the selected auxiliary supporting member is adjusted so that an angle between the upper surface of the selected auxiliary supporting member and the semiconductor wafer placed on the upper surface of the selected auxiliary supporting member is within ±0.2°.

12. The heat treatment method of a semiconductor wafer according to claim 8, wherein the inclination of the upper surface of the selected auxiliary supporting member is adjusted so that an angle between the upper surface of the selected auxiliary supporting member and the semiconductor wafer placed on the upper surface of the selected auxiliary supporting member is within ±0.2°.

13. The heat treatment method of a semiconductor wafer according to claim 5, further comprising:

processing the lower surface of the selected auxiliary supporting member based on the measured shape of the first supporting part such that the shape of the lower surface of the selected auxiliary supporting member accommodates the measured shape of the first supporting part.

14. The vertical boat for heat treatment according to claim 1, further comprising a spacer between a second auxiliary supporting member of the plurality of supporting members and the corresponding supporting part of the second auxiliary supporting member, the spacer having a shape that accommodates the shape of the corresponding supporting part of the second auxiliary supporting member such that the upper surface of the second auxiliary support member is at a predetermined inclination when the second auxiliary support member is attached to the corresponding supporting part of the second auxiliary supporting member.

15. The heat treatment method of a semiconductor wafer according to claim 5, further comprising:

for a second supporting part, selecting a spacer having a shape to accommodate the measured shape of the second supporting part, and attaching the spacer between the second supporting part and the corresponding auxiliary supporting member of the second supporting part; and then adjusting an inclination of the upper surface of the corresponding auxiliary supporting member of the second supporting part based on the measured shape of the second supporting part.

16. A vertical boat for heat treatment comprising: a plurality of supporting columns, each supporting column extending vertically between an upper end and a lower end thereof; a pair of plate members, including an upper plate member coupled to the upper ends of the supporting columns and a lower plate member coupled to the lower ends of the supporting columns, the supporting columns comprising a plurality of slits spaced apart and a plurality of supporting parts interposed between the slits for horizontally supporting substrates to be treated, each supporting part being formed on the supporting column and having a curvilinear shape, a plurality of auxiliary supporting members, each auxiliary supporting member being removably attached to one and only one corresponding supporting part, each auxiliary supporting member having a lower surface and a downward extension that contacts an upper surface of the corresponding supporting part when the auxiliary supporting member is attached to the corresponding supporting part and an upper surface for contacting one of the substrates, and a spacer that is removably inserted between a first auxiliary supporting member of the plurality of auxiliary supporting members and the corresponding supporting part of the first auxiliary supporting member, the spacer being shaped to accommodate the shape of the corresponding supporting part such that the upper surface of the first auxiliary support member is at a predetermined inclination when the first auxiliary support member is attached to the corresponding supporting part of the first auxiliary supporting member.

17. The vertical boat for heat treatment according to claim 16, wherein the lower surface of a second auxiliary supporting member of the plurality of auxiliary supporting members is shaped to accommodate the shape of the corresponding supporting part of the second auxiliary supporting member such that the upper surface of the second auxiliary support member is at a predetermined inclination when the second auxiliary support member is attached to the corresponding supporting part of the second auxiliary supporting member.

18. A heat treatment method of a semiconductor wafer using the vertical boat for heat treatment according to claim 16, comprising steps of:

measuring the shape of each supporting part of each supporting column;

for a first supporting part, selecting a spacer having a shape that accommodates the measured shape of the first supporting part, and attaching the selected spacer between the first supporting part and the corresponding auxiliary supporting member of the first supporting part; then adjusting an inclination of the upper surface of the corresponding auxiliary supporting member of the first supporting part based on the measured shape of the first supporting part; then placing the semiconductor wafer onto the upper surface of the corresponding auxiliary supporting member of the first supporting part; and performing a heat treatment.

19. The heat treatment method of a semiconductor wafer according to claim 18, further comprising:

for a second supporting part, selecting an auxiliary supporting member from the plurality of auxiliary supporting members, the lower surface of the selected auxiliary supporting member being shaped to accommodate the measured shape of the second supporting part, and attaching the selected auxiliary supporting member onto the second supporting part.

20. The heat treatment method of a semiconductor wafer according to claim 18, wherein the inclination of the upper surface of the corresponding auxiliary supporting member of the first supporting part is adjusted so that an angle between the upper surface of the corresponding auxiliary supporting member of the first supporting part and the semiconductor wafer placed on the upper surface of the of the corresponding auxiliary supporting member of the first supporting part is within ±0.2°.

* * * * *